United States Patent [19]

Wakai et al.

[11] Patent Number: 5,032,883
[45] Date of Patent: Jul. 16, 1991

[54] THIN FILM TRANSISTOR AND METHOD OF MANUFACTURING THE SAME

[75] Inventors: Haruo Wakai; Nobuyuki Yamamura, both of Tokyo; Syunichi Sato, Kawagoe; Minoru Kanbara, Tokyo, all of Japan

[73] Assignee: Casio Computer Co., Ltd., Tokyo, Japan

[21] Appl. No.: 241,304

[22] Filed: Sep. 7, 1988

[30] Foreign Application Priority Data

Sep. 9, 1987 [JP] Japan .................. 62-225819
Sep. 25, 1987 [JP] Japan .................. 62-241607
Oct. 1, 1987 [JP] Japan .................. 62-248878

[51] Int. Cl.$^5$ ............................ H01L 29/78
[52] U.S. Cl. ...................... 357/23.7; 357/4; 357/30
[58] Field of Search ............. 357/23.7, 4, 30

[56] References Cited

U.S. PATENT DOCUMENTS 3,765,747 10/1973 Pankrantz et al. .
3,840,695 10/1974 Fischer .
3,862,360 1/1975 Dill et al. .
4,821,092 4/1989 Noguchi .................. 357/23.7 X

OTHER PUBLICATIONS

Article from "Proceedings of the Ire" Entitled "The TFT-A New Thin-Film Transistor" Paul K. Weimer, pp. 1462-1469.
Article from IEEE Transactions on Electron Devices, Nov. 1973, vol. ED-20, No. 11, index page and pp. 995-1001.

*Primary Examiner*—Martin H. Edlow
*Attorney, Agent, or Firm*—Frishauf, Holtz, Goodman & Woodward

[57] ABSTRACT

A TFT of the present invention includes a transparent insulative substrate, a gate electrode formed on the substrate, a gate insulating film formed on at least the gate electrode, a semiconductor film formed at a position on the gate insulating film corresponding to the gate electrode, source and drain electrodes arranged on the semiconductor film so as to form a channel portion, a transparent insulating film covering the source and drain electrodes and the semiconductor film, and a transparent electrode connected to the source electrode. A through hole is formed in the transparent insulating film above the source electrode. The transparent electrode is formed on a portion of the transparent insulating film except for a portion above the channel portion on the semiconductor film.

19 Claims, 12 Drawing Sheets

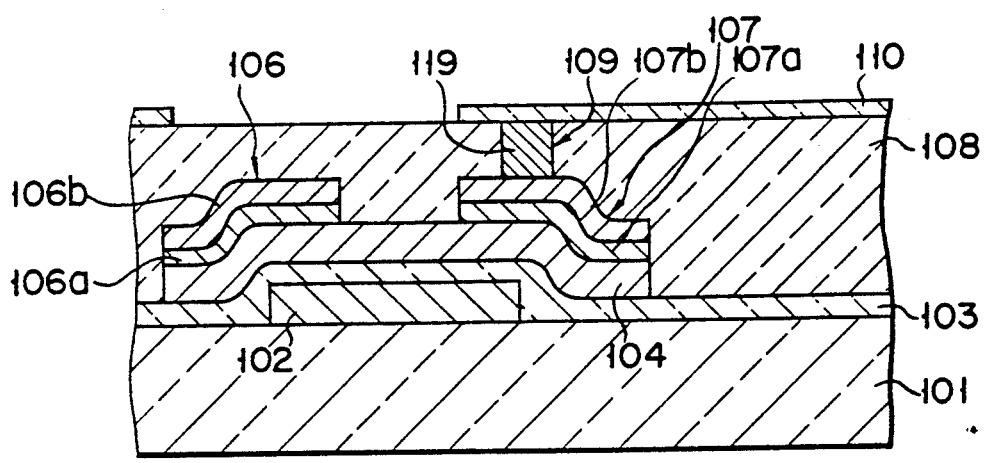
F I G. 9
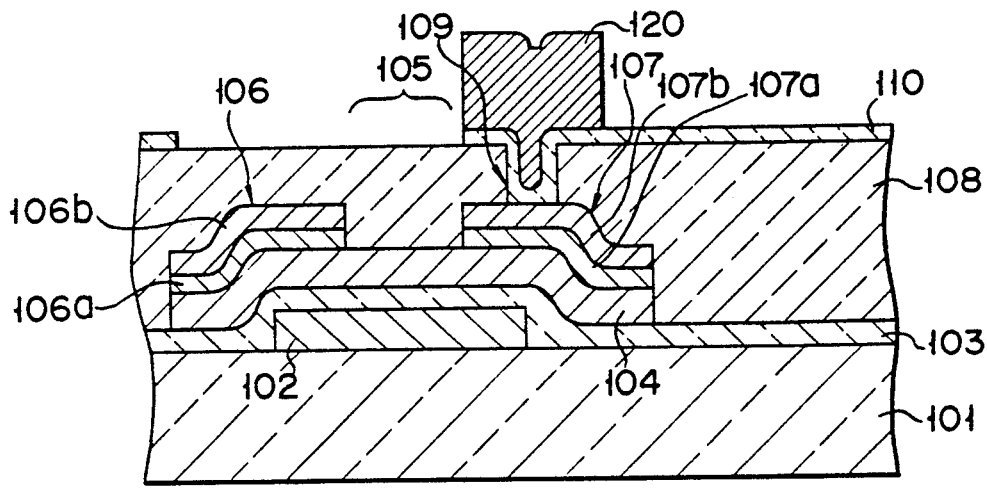
F I G. 10
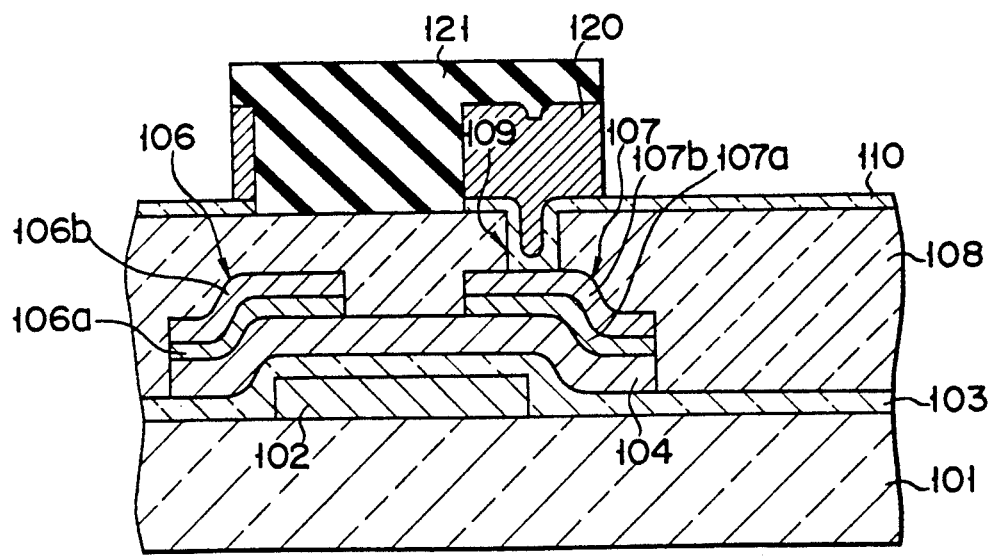
F I G. 11

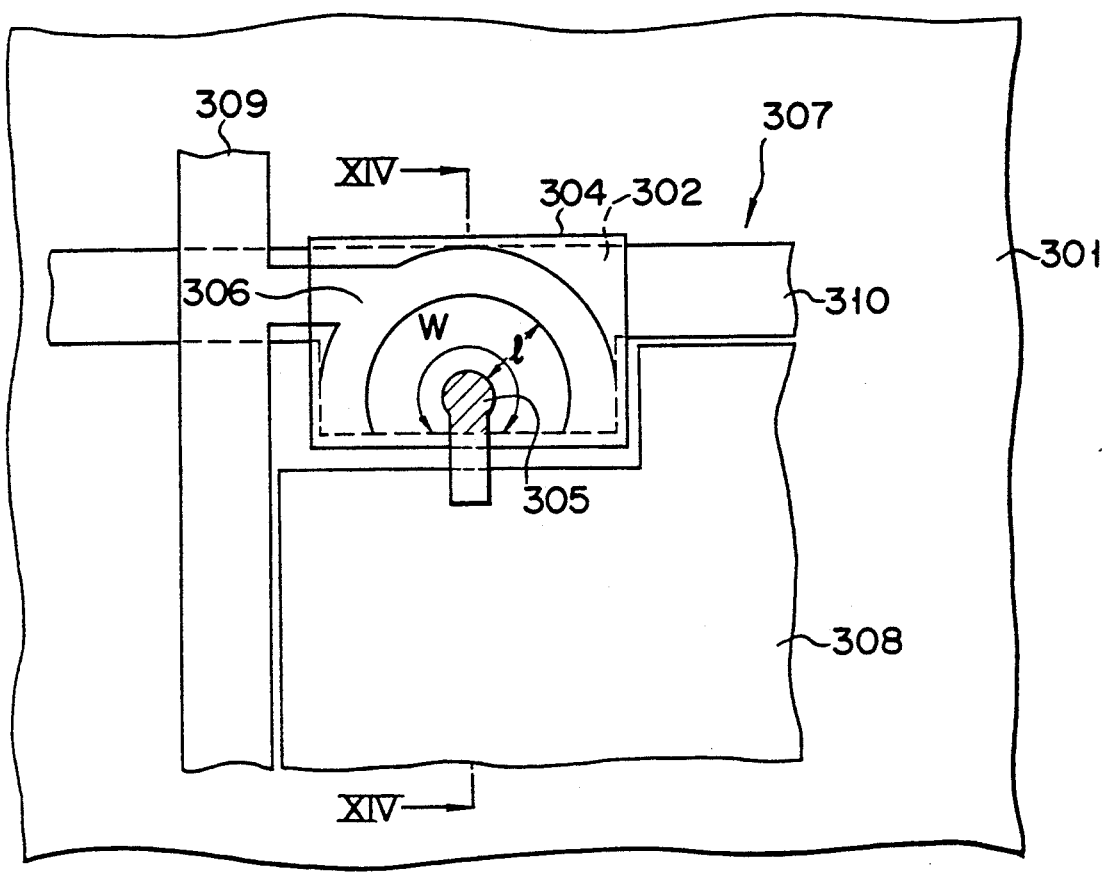
F I G. 14
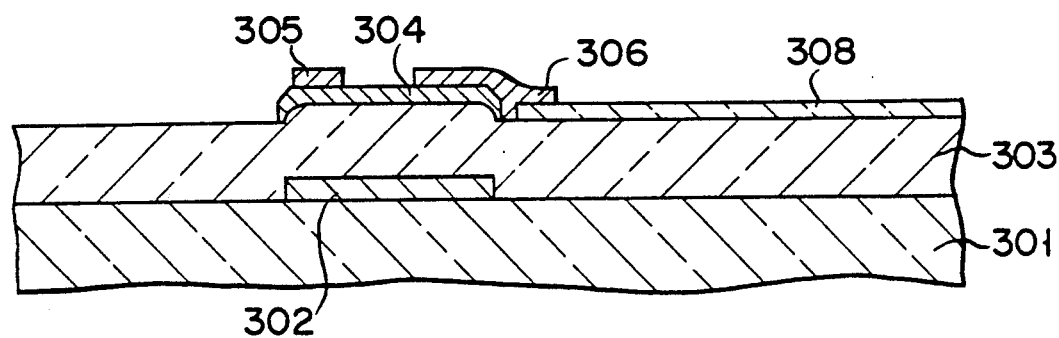
F I G. 15

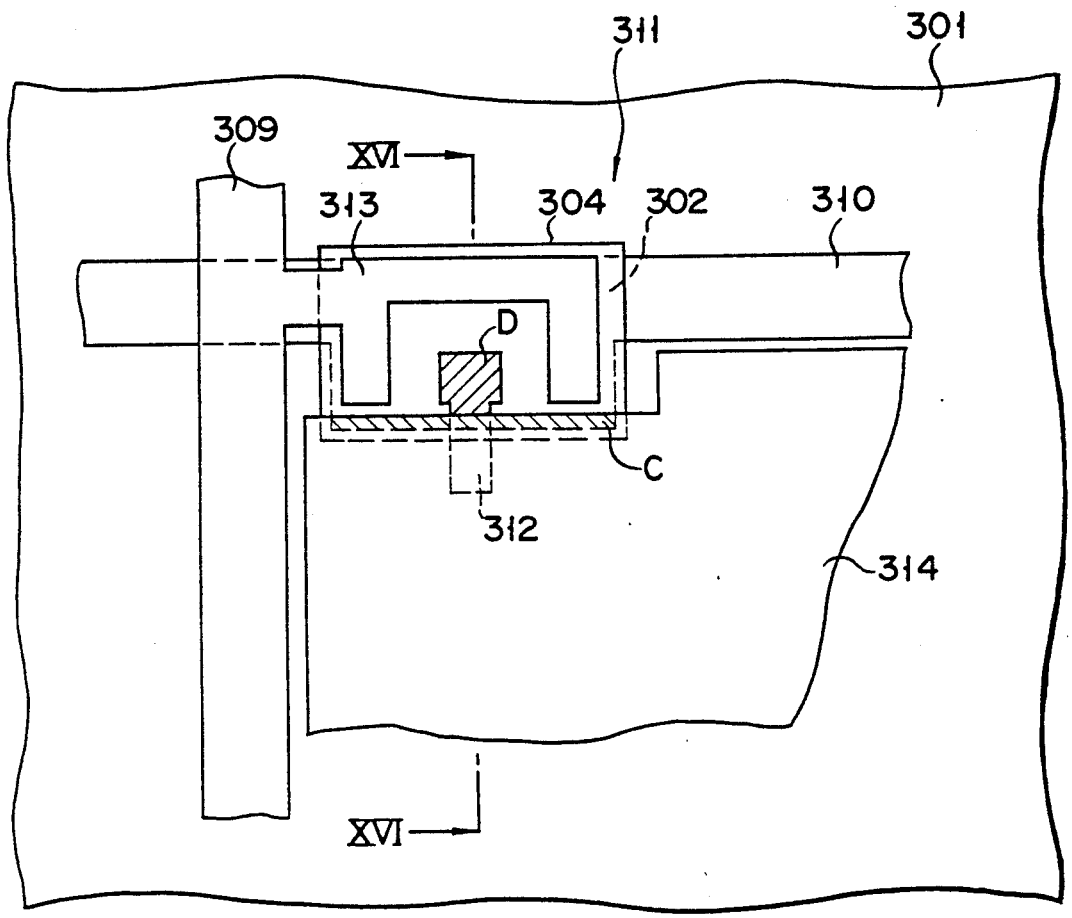
F I G. 16
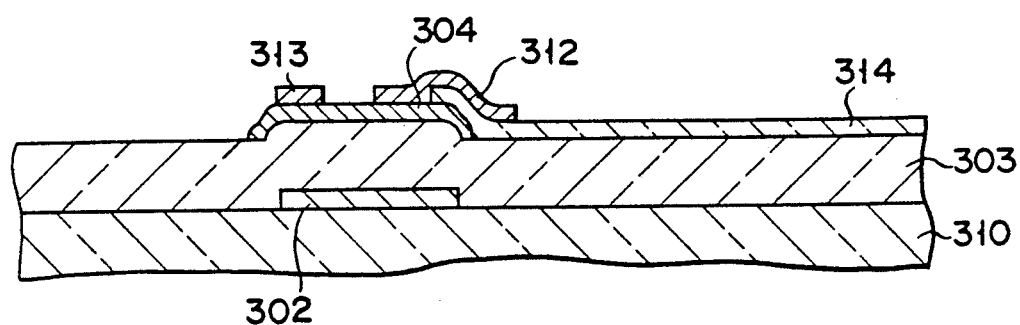
F I G. 17

THIN FILM TRANSISTOR AND METHOD OF MANUFACTURING THE SAME

BACKGROUND OF THE INVENTION

1. Field of the Invention

The present invention relates to a thin film transistor (to be referred to as a TFT hereinafter) formed by stacking thin films, such as a gate electrode, a gate insulating film, a semiconductor, a source electrode, and a drain electrode, on a transparent insulating substrate, and a method of manufacturing the same.

2. Description of the Related Art

Conventional TFTs as switching elements are disclosed in Japanese Utility Model Publication No. 44-5572 (U.S. Ser. No. 132095), Japanese Patent Publication No. 41-8172 (U.S. Ser. No. 344921), and P. K. Weimer, "The TFT—A New Thin-Film Transistor", PROCEEDINGS OF THE IRE, June, 1962. Liquid crystal display panels using such TFTs are disclosed in "A 6×6 Inch 20 lines-Per-Inch Liquid Crystal Display Panel", IEEE Transactions on Electron Device, vol. ED-20, No. 11, Nov. 1973 and U.S. Pat. No. 3,840,695.

On the other hand, U.S. Pat. Nos. 3,765,747 and 3,862,360, and Japanese Patent Disclosure (Kokai) Nos. 55-32026, 57-20778, and 58-21784 disclose a technique wherein a MOS transistor is formed on a monocrystalline semiconductor substrate, and the resultant structure is used as one of the substrates of a liquid crystal display panel. However, if liquid crystal panels are constituted by these semiconductor substrates, only reflection type displays can be obtained. In addition, the manufacturing process of such panels are as complex as that of LSIs. Moreover, it is difficult to obtain a large display panel.

The above-described active matrix liquid crystal panels, therefore, currently use the TFTs as switching elements. The structures of these TFTs can be classified into a coplanar type, an inverted coplanar type, a staggered type, and an inverted staggered type, as disclosed in the article by P. K. Weimer. Of these types, the inverted staggered type TFT can be formed by stacking a plurality of thin films successively in a vacuum. For this reason, the number of manufacturing steps is substantially decreased. As a result, the characteristics of a product are stabilized, and the rate of occurrence of defective transistors is decreased.

FIGS. 1 and 2 show structures of the abovedescribed inverted staggered type TFT and a TFT array obtained by arranging a plurality of such inverted staggered type TFTs on an insulating substrate. Referring to FIGS. 1 and 2, a plurality of TFTs 1 are arranged on transparent insulating substrate 2 in the form of a matrix. Gate electrodes 3 of TFTs 1 are commonly connected through gate line 4 in the row direction. Drain electrodes 5 of TFTs 1 are commonly connected through drain line 6 in the column direction. Source electrode 7 of each TFT 1 is connected to transparent electrode 8 independently formed in an area surrounded by gate and drain lines 4 and 6 (an electrode to which a data signal is supplied will be referred to as a drain electrode hereinafter). More specifically, as shown in FIG. 2, gate electrode 3 consisting of Cr or the like is formed on transparent glass substrate 2, and gate insulating film 9 consisting of silicon oxide or silicon nitride is formed on the upper surface of glass substrate 2 including the upper surface of gate electrode 3. Semiconductor film 10 consisting of amorphous silicon is stacked on gate insulating film 9 above gate electrode 3. Drain and source electrodes 5 and 7 are formed on semiconductor film 10. They are separated from each other by a predetermined distance so as to form channel portion 11. Drain and source electrodes 5 and 7 respectively have contact layers 5a and 7a, and metal layers 5b and 7b, and are electrically connected to semiconductor 10. Source electrode 7 is connected to transparent electrode 8 consisting of Indium-Tin-Oxide (to be referred to as an ITO hereinafter).

In the TFT used for the above-described TFT array, since part of drain electrode 5, drain line 6, and transparent electrode 8 are formed on gate insulating film 9, both the electrodes tend to be short-circuited, and hence the rate of occurrence of defects becomes high. Especially in the TFT array using this TFT, since transparent electrode 8 is formed in a region surrounded by gate and drain lines 4 and 6, short-circuiting tends to occur between transparent electrode 8 and drain line 6.

In order to prevent such short-circuiting, predetermined distance L determined by process and alignment precision in formation of transparent electrode 8 and drain line 6 is formed therebetween. Distance L is normally set to be a large value, e.g., 20 μm or more. Although the formation of such large distance L can prevent the above-described short-circuiting, the area of transparent electrode 8 is reduced. That is, the problem of reduction in effective display area is posed. For example, the opening ratio, i.e., the ratio of the area of transparent electrode 8 to an area for arranging one TFT and one transparent electrode on glass substrate 2 becomes as small as about 50% even if distance L is set to be a minimum value of 20 μm.

As described with reference to Japanese Patent Disclosure (Kokai) No. 55-32026, in the transistor array obtained by arraying MOS transistors using the monocrystalline semiconductor substrate, unevenness of the upper surface of the substrate occurs because of the formation of the transistors. Therefore, in order to flatten the upper surface and form a uniform orientation film, an insulating film is deposited on the transistors, and reflecting electrodes for receiving data signals are formed on the insulating film. According to such a transistor having a MOS structure, since the gate electrode is formed on the semiconductor substrate, an unnecessary electric field is not applied to the channel portion by a data signal supplied to the transparent electrode formed above the channel portion.

In the above-described inverted staggered type TFT, however, since the gate electrode is formed on the substrate, electric fields tend to be applied to the semiconductor film from electrodes other than the gate electrode.

It is, therefore, difficult to obtain a TFT which can be stably operated without causing short-circuiting between the drain electrode and drain line, and the transparent electrode connected to the source electrode, and can be easily manufactured.

SUMMARY OF THE INVENTION

The present invention has been made in consideration of the above-described technical problems, and has as its object to provide a TFT which can be stably operated, has small rate of occurrence of defects, and can be easily manufactured, and a method of manufacturing the same.

In order to achieve this object, a TFT according to the present invention comprises:

a transparent insulative substrate;

a gate electrode formed on the substrate;

a gate insulating film formed on at least the gate electrode;

a semiconductor film formed at a position on the gate insulating film corresponding to the gate electrode;

source and drain electrodes formed on at least a portion of the semiconductor film corresponding to the gate electrode so as to be separated from each other by a predetermined distance to form a channel portion on the semiconductor film, the source and drain electrodes being electrically connected to the semiconductor film;

an insulating film covering at least the drain electrode; and a transparent electrode formed on a portion except for a portion above the channel portion on the semiconductor film and on at least part of the insulating film, and electrically connected to the source electrode.

According to the TFT of the present invention having the above-described arrangement, since the insulating film is formed on the drain electrode, and the transparent electrode electrically connected to the source electrode is formed on the resultant structure, these electrodes are not short-circuited. In addition, since the TFT of the present invention is of an inverted staggered type, the respective films to be stacked can be formed in successive steps. Therefore, the manufacture can be facilitated.

Moreover, according to a TFT array obtained by arraying a plurality of TFTs of the present invention on a transparent glass substrate, since the substrate consists of a glass, a transmission type display device can be obtained. In this case, since a pixel electrode constituted by the transparent electrode connected to the source electrode is not short-circuited to the drain electrode and drain line, the pixel electrode can be arranged near the drain electrode and drain line, or can be overlapped thereon. As a result, the opening ratio of the display becomes very high.

BRIEF DESCRIPTION OF THE DRAWINGS

FIG. 9 is a sectional view showing a TFT array according to a fourth embodiment of the present invention;

FIG. 10 is a sectional view showing a TFT array according to a fifth embodiment of the present invention;

FIG. 11 is a sectional view showing a TFT array according to a sixth embodiment of the present invention;

FIG. 14 is a plan view showing a structure of another TFT to which the present invention can be applied;

FIG. 15 is a sectional view showing the TFT in FIG. 14 taken along line XIV—XIV thereof;

FIG. 16 is a plan view showing a TFT as a modification to which the present invention can be applied;

FIG. 17 is a sectional view showing the TFT in FIG. 16 taken along line XVI—XVI thereof.

Detailed Description of the Preferred Embodiments

Embodiments of the present invention will be described in detail below with reference to the accompanying drawings.

Figure 3:
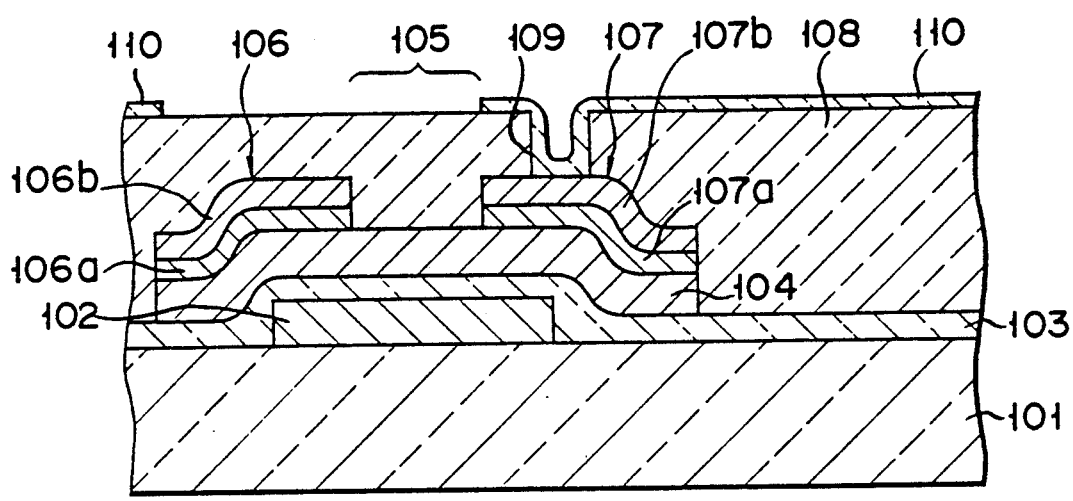
FIG. 3 is a sectional view showing a TFT according to a first embodiment of the present invention.

FIG. 3 shows a sectional structure of a TFT according to the present invention. A first embodiment will be described below with reference to FIG. 3. Gate electrode 102 consisting of Cr and having a thickness of about 1,000 Å is formed on insulating substrate 101 consisting of a transparent glass plate. Gate insulating film 103 consisting of silicon nitride or silicon oxide and having a thickness of about 3,000 Å is formed on the upper surface of insulating substrate 101 including the upper surface of gate electrode 102. Semiconductor film 104 consisting of amorphous silicon and having a thickness of about 1,000 Å is formed on gate insulating film 103 so as to cover a portion above gate electrode 102 and its peripheral portion. Drain and source electrodes 106 and 107 are formed on semiconductor film 104. They are separated from each other by a predetermined distance so as to form channel portion 105. In order to electrically connect drain and source electrodes 106 and 107 to semiconductor film 104, electrodes 106 and 107 are respectively constituted by contact films 106a and 107a each consisting of amorphous silicon which is doped with an impurity at a high concentration and having a thickness of about 500 Å, and conductive layers 106b and 107b each consisting of a conductive metal material such as Cr and having a thickness of about 1,000 Å. In addition, transparent insulating film 108 consisting of $SiO_2$, polyimide, or an acrylic resin is deposited on substantially the entire exposed surface above insulating substrate 101 on which the above-described films are stacked in a predetermined form. Drain electrode 106 is covered with insulating film 108 so as to be insulated from other electrodes. The thickness of insulating film 108 on drain and source electrodes 106 and 107 is about 3,000 Å. Insulating film 108 fills recesses generated upon formation of the above thin films and flattens the surface above insulating substrate 101. Through hole 109 extending through insulating film 108 is formed in a portion of insulating film 108 above source electrode 107. In addition, transparent electrode 110 consisting of ITO and having a thickness of about 1,000 Å is formed on the upper surface of insulating film 108. Transparent electrode 110 extends into through hole 109 and hence is electrically connected to source electrode 107. A portion of transparent electrode 110 above channel portion 105 of semiconductor film 104 formed between drain and source electrodes 106 and 107, and its portion above drain electrode 106 are mostly removed. That is, transparent electrode 110 above channel portion 105 must be removed so as to prevent an unnecessary electric field from being applied to channel portion 105. Furthermore, in order to decrease a parasitic capacitance, transparent electrode 110 is formed above drain electrode 106 such that its edge slightly overlaps the edge of drain electrode 106. Note that since the parasitic capacitance is small, transparent electrode 110 may overlap drain electrode 106. If the thickness of insulating film 108 on drain and source electrodes 106 and 107 is excessively small, the insulation property is degraded. In contrast to this, if it is excessively large, connection to the transparent electrode through through hole 109 formed on source electrode 107 becomes difficult. For this reason, the thickness of insulating film 108 preferably falls within the range of 2,000 to 8,000 Å.

In the TFT having the above structure, since insulating film 108 is formed at least on drain electrode 106, the probability of short-circuiting between drain and source electrodes 106 and 107 is considerably decreased. In addition, since transparent electrode 110 is not present above channel portion 105 of semiconductor film 104, an unnecessary electric field is not applied to channel portion 105, and hence the TFT can be stably operated.

A method of manufacturing the TFT according to the first embodiment of the present invention will be described below with reference to FIGS. 4A to 4F.

Figure 4A:
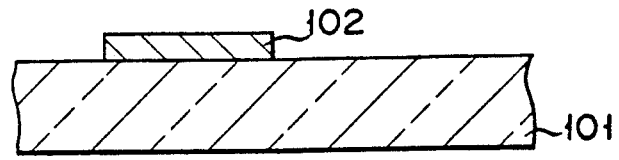
FIGS. 4A to 4F are sectional views for explaining the steps in manufacturing the TFT of the present invention in FIG. 3.

As shown in FIG. 4A, a metal film having a thickness of, e.g., about 1,000 Å is deposited by sputtering or vapor deposition on transparent insulating substrate 101 having a cleaned surface. The metal film is patterned by photolithography or the like to form gate electrode 102. Insulating substrate 101 may consist of glass, quartz, sapphire, or the like. Gate electrode 102 consists of chromium, titanium, tungsten, tantalum, copper, or the like.

Figure 4B:
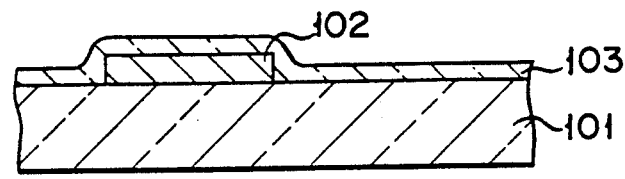
Figure 4C:
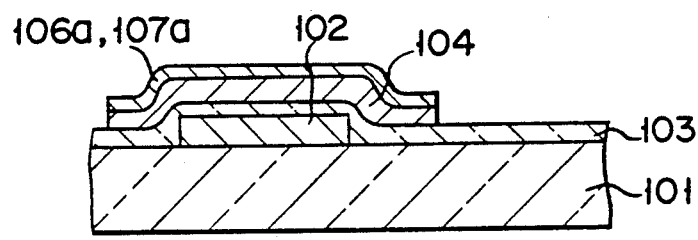

As shown in FIG. 4B, gate insulating film 103 is then formed on the entire surface of insulating substrate 101 by plasma CVD or the like so as to have a thickness of, e.g., 3,000 Å and cover gate electrode 102. A silicon nitride (SiN) film, silicon oxide ($SiO_2$) film, or the like is used as gate insulating film 103. Subsequently, as shown in FIG. 4C, semiconductor film 104 consisting of amorphous silicon (a-i-Si) or the like and contact film 106a (107a) consisting of amorphous silicon (a-n+-Si) which is doped with an impurity at high concentration are continuously formed/stacked by plasma CVD or the like on gate insulating film 103 so as to have thicknesses of, e.g., 1,000 Å and 500 Å, respectively. Semiconductor film 104 and contact film 106a (107a) are patterned by photolithography or the like so as to cover a portion above gate electrode 102 and its peripheral portion. Instead of the above amorphous silicon, amorphous silicon carbide (SiC), tellurium, selenium, gerumanium, cadmium sulfide (CdS), cadmium selenide (CdSe), or the like may be used as a material for semiconductor film 104 and contact film 106a (107a).

Figure 4D:
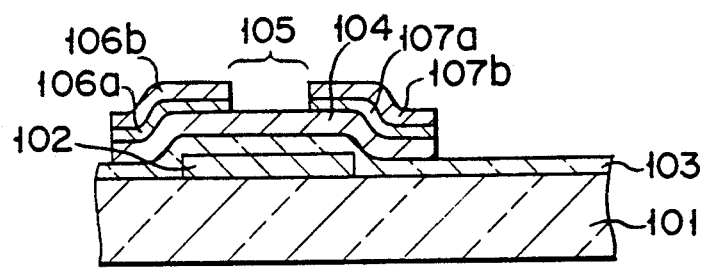

A 1,000 Å thick metal film is then formed on the entire surface above insulating substrate 101 by vapor deposition, sputtering, or the like so as to cover contact film 106a (107a). The metal film is patterned by photolithography or the like to remove contact film 106a (107a) above channel portion 105, thereby forming drain and source electrodes 106 and 107 above gate electrode 102, which are separated from each other by a predetermined distance, as shown in FIG. 4D. Chromium, titanium, tungsten, tantalum, copper, or the like is used as a material for metal films 106b and 107b of drain and source electrodes 106 and 107.

Figure 4E:
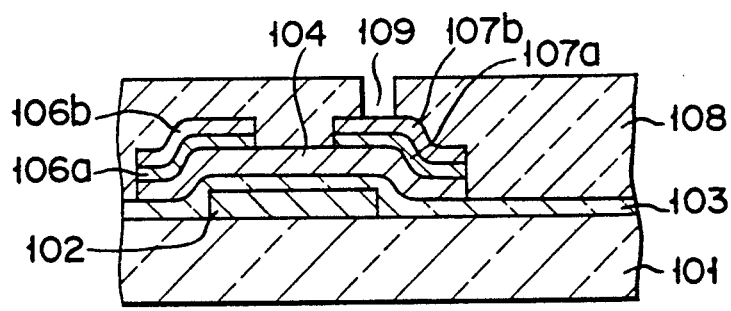

As shown in FIG. 4E, transparent insulating film 108 is formed above insulating substrate 101 so as to cover at least drain electrode 106 and flatten the surface. As transparent insulating film 108, an organic insulating film obtained by coating and baking polyimide or an acrylic resin using a spin coat method, or an $SiO_2$ inorganic insulating film (SOG film) obtained by coating and baking a silanol compound using a spin coat method is used. The thickness of transparent insulating film 108 on drain electrode 106 is about 3,000 Å. Subsequently, contact hole 109 is formed in transparent insulating film 108 above source electrode 107 by etching.

Figure 4F:
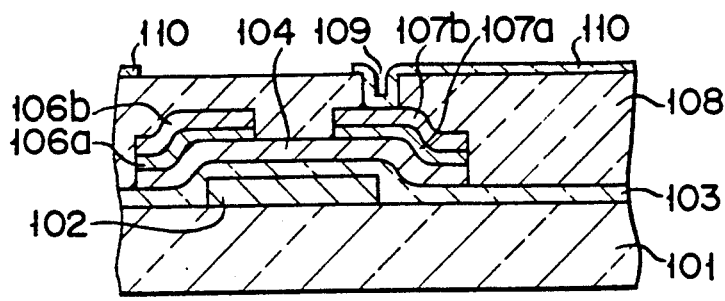

Finally, as shown in FIG. 4F, a transparent conductive material such as ITO, tin oxide ($SnO_2$), or indium oxide ($In_2O_3$) is sputtered on the surface of transparent insulating film 108 including contact hole 109 to a thickness of about 1,000 Å. Then, portions of this transparent conductive material above channel portion 105 of semiconductor film 104 and overlapping drain electrode 106 through transparent insulating film 108 are removed. With the above process, fabrication of the TFT is completed.

According to the above-described manufacturing method, since the step of forming transparent electrode 110 in which a defect generally tends to occur becomes the last step, even if a defect occurs in this step, the immediately preceding step can be repeated, thereby reducing the ratio of occurrence of defects.

Figure 5:
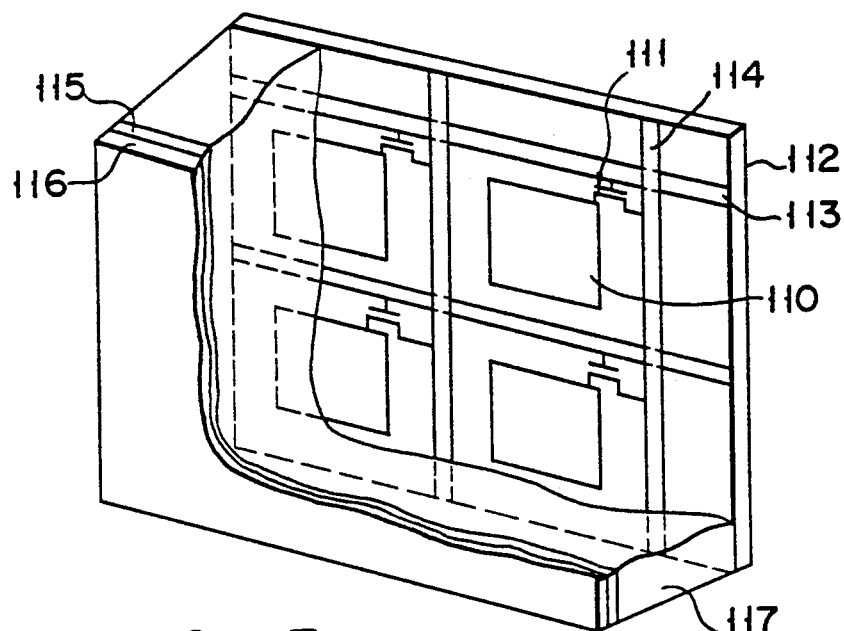
FIG. 5 is a schematic view showing an arrangement of a liquid crystal display element using the TFT of the present invention.
Figure 6:
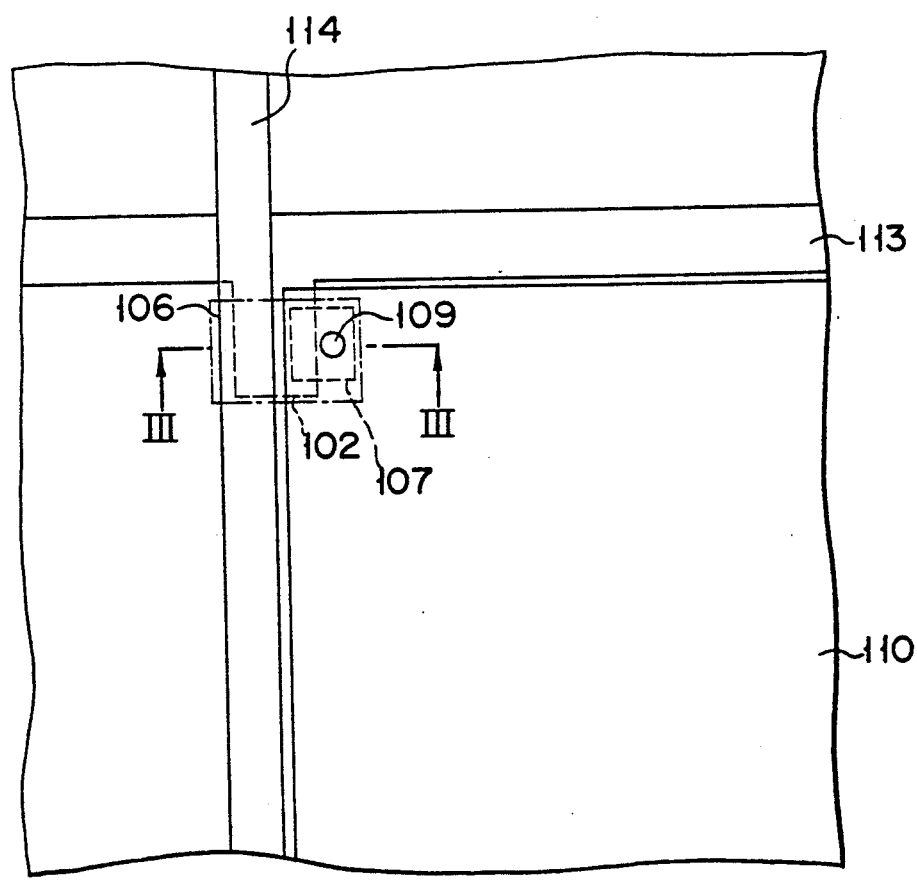
FIG. 6 is a partially enlarged view showing a TFT array obtained by arranging a plurality of TFTs of the present invention.

As shown in FIGS. 5 and 6, a plurality of TFTs of the present invention are arranged on a transparent insulating substrate in the form of a matrix, and are used as a liquid crystal display device. More specifically, a plurality of TFTs 111 are arrayed on transparent insulating substrate 112 in the column and row directions. Gate electrodes 102 of the respective TFTs are commonly connected to gate line 113 in the row direction. Drain electrodes 106 of the respective TFTs are commonly connected to drain line 114 in the column direction. Source electrodes 107 of TFTs 111 are connected to transparent electrodes 110, which are substantially formed into squares, through through holes 109. Transparent electrodes 110 are respectively arranged in a plurality of regions surrounded by gate and drain lines 113 and 114, and are electrically independent from each other. The edges of each transparent electrode 110 are located near gate and drain lines 113 and 114, or slightly overlap them. The above-described sectional structure shown in FIG. 3 corresponds to a sectional structure taken along line III—III in FIG. 6.

Opposite transparent substrate 116 having transparent electrode 115 formed on its entire surface is placed on the substrate on which TFTs 111 are arranged in the form of a matrix in the above-described manner so as to oppose it. A liquid crystal display device is obtained by sealing liquid crystal 117 between these substrates. In this liquid crystal display device, one transparent electrode 110 is a pixel electrode corresponding to one pixel for image display. These pixel electrodes do not overlap the channel portions of the TFTs connected to the adjacent pixel electrodes, and areas where the pixel electrodes overlap the corresponding drain electrodes are minimized.

The above-described liquid crystal display device is operated in the following manner. Scan signals are sequentially supplied to a plurality of gate lines 113. Data signals for controlling the ON/OFF states of the respective pixels are supplied to a plurality of drain lines 114 in accordance with the timings of the scan signals. TFT 111 whose gate electrode 102 has received a scan signal is turned on, reads a data signal supplied at that timing, and supplies it to pixel electrode 110. An electric field is applied to liquid crystal 117 located between the pixel electrode which has received the data signal and transparent electrode 115 of opposite substrate 116 in accordance with a potential difference between the opposite electrodes. Then, the orientation state of the molecules of liquid crystal 117 is changed, and thus transmission and interception of light are controlled.

Figure 1:
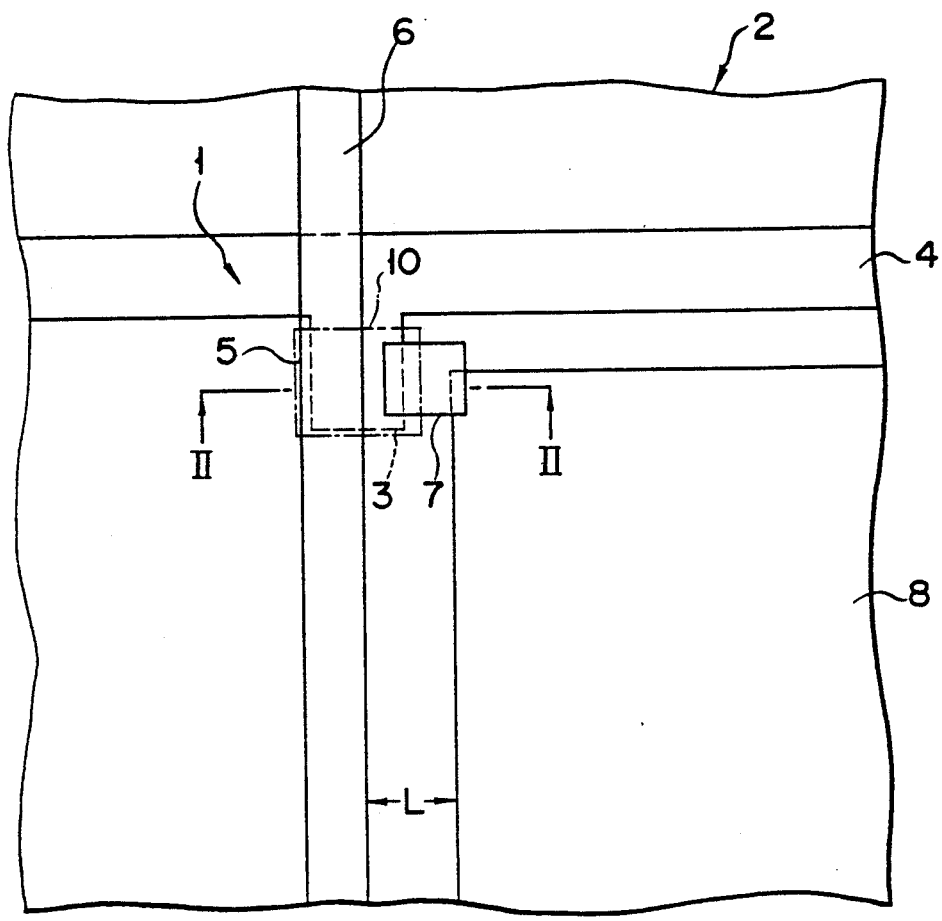
FIG. 1 is a plan view showing a prior art.
Figure 2:
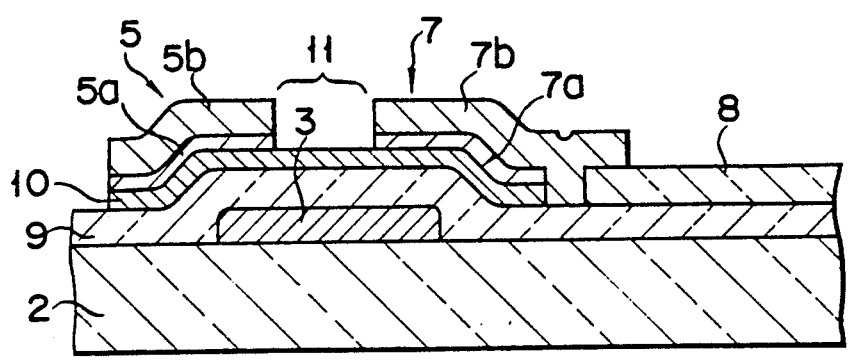
FIG. 2 is a sectional view showing the prior art in FIG. 1 taken along line II—II thereof.

As described above, according to the liquid crystal display device using the TFT of the present invention, since transparent insulating film 108 is formed on at least drain electrode 106 of the TFT, and transparent electrode 110 is formed on the resultant structure, short-circuiting between transparent electrode 110 and drain electrode 106 can be prevented. In addition, the distance between transparent electrode 110 and drain electrode 106, i.e., distance L in FIG. 1, can be set to be zero. Moreover, transparent electrode 110 may be arranged so as to overlap drain and gate lines 114 and 113. With this arrangement, the entire region except for an opaque region (semiconductor film 104, source and drain electrodes 107 and 106, and gate and drain lines 113 and 114) can be made an effective display area, and hence a maximum effective display area can be obtained. According to the embodiment, an opening ratio of 70% can be realized (50% in the conventional device). Since the step of forming the transparent electrode is the last one, and the source electrodes of all the TFTs are commonly connected upon deposition of the transparent conductive film before the step of separating the transparent conductive film individually is executed operations of all the TFTs can be measured within a short period of time by bringing the probe of a measuring device into contact with a plurality of gate and drain lines 113 and 114, and the transparent conductive film and supplying test signals.

Another embodiment of the present invention will be described below with reference to FIGS. 7 to 11, and FIGS. 12A to 12C. The same reference numerals in these drawings denote the same parts as in the first embodiment of FIG. 3, and a description thereof will be omitted.

Figure 7:
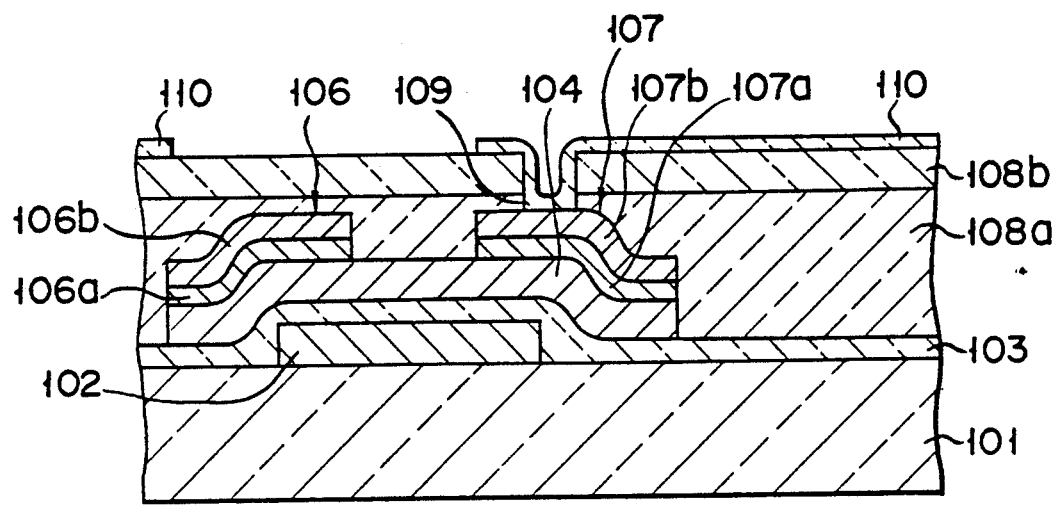
FIG. 7 is a sectional view showing a TFT array according to a second embodiment of the present invention.

FIG. 7 shows a second embodiment of the present invention. In the second embodiment, first and second insulating films 108a and 108b are deposited to cover drain and source electrodes 106 and 107, and transparent electrode 110 is formed on the resultant structure. First insulating film 108a is an SiO₂ film obtained by dissolving a silanol compound in a solvent, coating the resultant solution by a spin coat method, and baking the coated film. First insulating film 108a is used to flatten the uneven surface above an insulating substrate. Second insulating film 108b is a nitride film obtained by chemical vapor deposition (CVD), and is used to improve an insulation property. According to the second embodiment, flattening of the surface above insulating substrate 101 can be reliably performed, and the insulation property and the like can be reliably protected.

Figure 8:
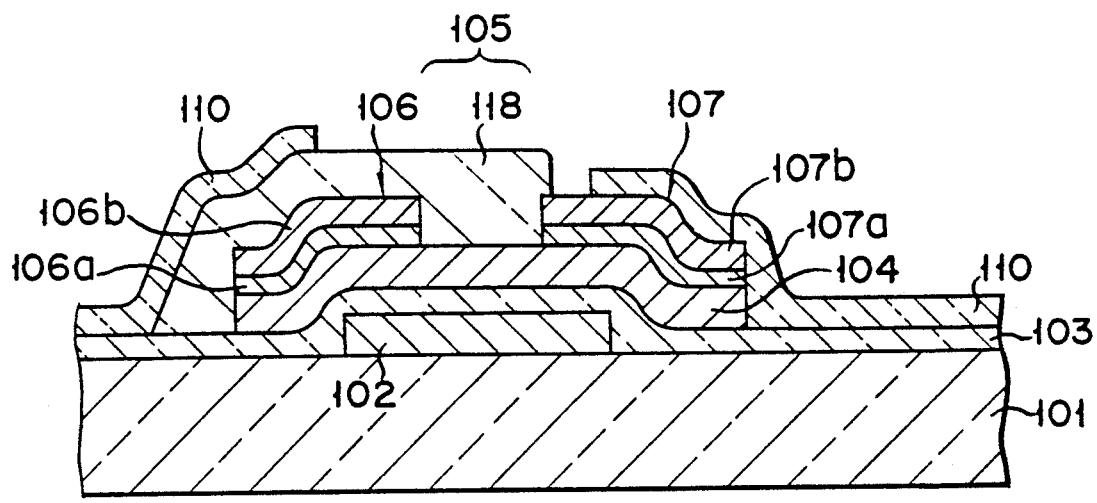
FIG. 8 is a sectional view showing a TFT array according to a third embodiment of the present invention.

FIG. 8 shows a third embodiment of the present invention. In the third embodiment, transparent electrode 110 is formed without flattening the surface above insulating substrate 101. Insulating film 118 is formed on only channel portion 105 and drain electrode 106 so as to protect channel portion 105 and insulate drain electrode 106 from transparent electrode 110. Accordingly, transparent electrodes 110 of one TFT and an adjacent TFT are not present above channel portion 105, and the area where transparent electrode 110 overlaps drain electrode 106 is small. Therefore, short-circuiting between transparent electrode 110 and drain electrode 106 does not occur, and an electric field is not applied from transparent electrode 110 to channel portion 105.

FIG. 9 shows a fourth embodiment of the present invention. In the fourth embodiment, contact metal 119 consisting of a conductive metal material is buried in through hole 109 formed above source electrode 107, and transparent electrode 110 is deposited on the resultant structure, thereby electrically connecting source electrode 107 to transparent electrode 110. Contact metal 119 consists of nickel, gold, silver, chromium, or the like, and is formed in through hole 109 by electroless plating. According to the fourth embodiment, since source and transparent electrodes 107 and 110 are connected to each other through contact metal 119, electrical connection therebetween can be ensured.

FIG. 10 shows a fifth embodiment of the present invention. In the fifth embodiment, contact metal 120 consisting of chromium, copper, aluminum, or the like is stacked on transparent electrode 110 formed in through hole 109 of transparent film 108. According to the fifth embodiment, electrical connection between source and transparent electrodes 107 and 110 can be ensured.

FIG. 11 shows a sixth embodiment of the present invention. In the sixth embodiment, shield film 121 is formed above contact metal 120, channel portion 105, and drain electrode 106 shown in the fifth embodiment so as to prevent a decrease in OFF resistance of the TFT due to radiation of external light onto channel portion 105.

Figure 12A:
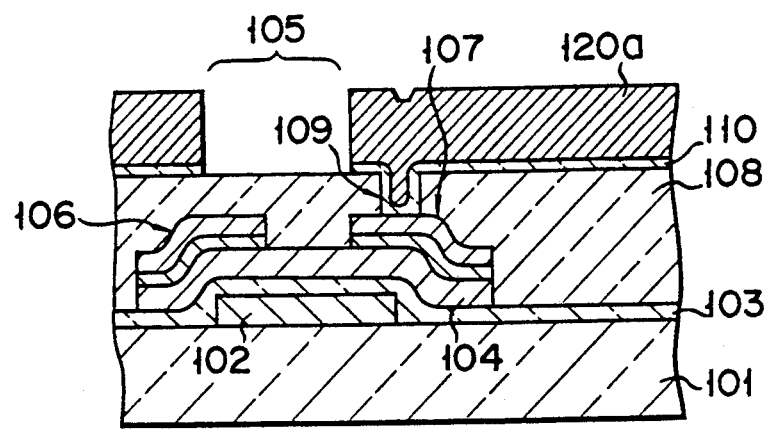
FIGS. 12A to 12C are sectional views for explaining the steps in manufacturing the TFT array according to the sixth embodiment in FIG. 11.
Figure 12B:
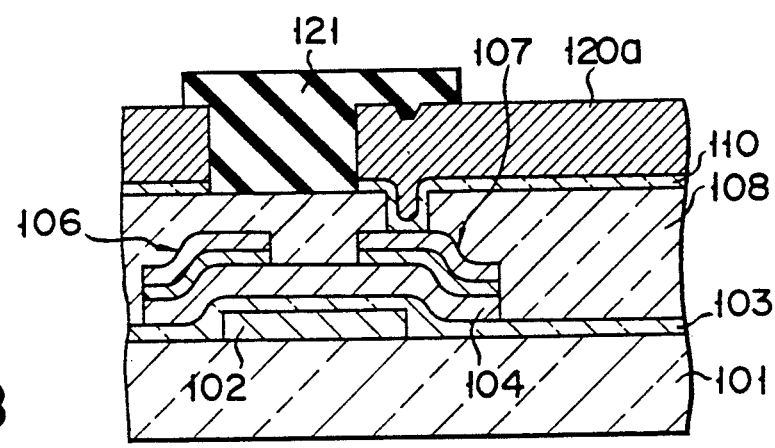
Figure 12C:
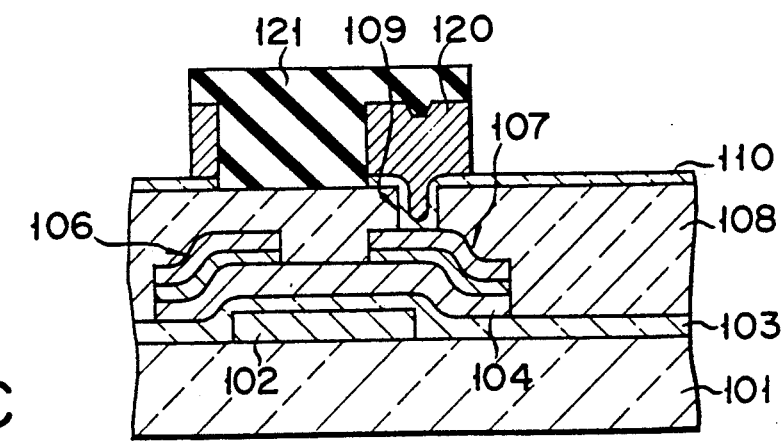

Contact metal 120 and shield film 121 in the sixth embodiment are formed in the following manner. As shown in FIG. 12A, a transparent electrode film consisting of ITO and having a thickness of 500 to 1,000 Å and metal conductive film 120a consisting of chromium, copper, or aluminum and having a thickness twice the depth of contact hole 109, e.g., about 6,000 Å are continuously stacked on the surface above insulating substrate 101 including transparent insulating film 108 and contact hole 109, and parts of the stacked films above channel portion 105 and on drain electrode 106 are removed. Subsequently, as shown in FIG. 12B, a shield material consisting of a transparent and insulating resin or a metal oxide is stacked on the resultant structure. Then, the shield material is etched so as to be left on regions including a region above through hole 119 of metal conductive film 120a and a region above channel portion 105, thereby forming shield film 121. After this process, as shown in FIG. 12C, metal conductive film 120a is etched by using shield film 121 as a resist to remove metal conductive film 120a from the surface of transparent electrode 110, thereby forming contact metal 120 on through hole 109. According to the sixth embodiment, since contact metal 120 is patterned by using shield film 121 as a resist, contact metal 120 can be formed substantially without increasing the number of steps in manufacturing.

Figure 13A:
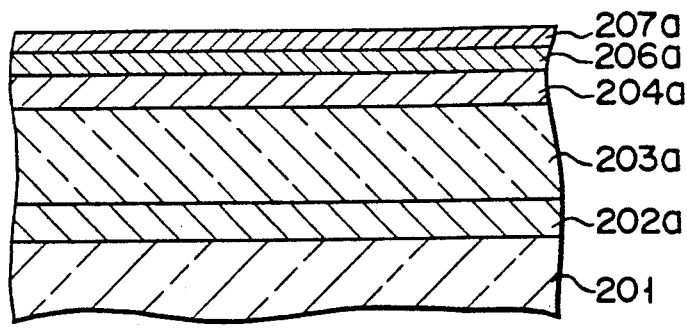
FIGS. 13A to 13G are sectional views for explaining the steps in manufacturing a TFT array to which the present invention can be applied.

A structure of a TFT to which the present invention can be applied will be described below. FIGS. 13A to 13G show the steps of manufacturing this TFT. FIG. 13G shows a finished TFT. As shown in FIG. 13G, in the TFT, gate electrode 202, gate insulating film 203, and semiconductor film 204 are stacked on transparent insulating substrate 201 and formed into the same shape. Contact films 206 each consisting of a semiconductor layer having a high impurity concentration, ohmic contact electrodes 207, and metal electrodes 209, all pairs of which have the identical shapes, are formed on semiconductor film 204 so as to be separated from each other by a predetermined distance to form channel portion 205. Drain and source electrodes 211 and 210 are respectively constituted by contact films 206, ohmic contact electrodes 207, and metal electrodes 209. Transparent insulating film 208 is formed on a portion outside the stacked thin films to the height of ohmic contact electrode 207. In addition, pixel electrode 212 is formed on transparent insulating film 208 so as to be in contact with metal electrode 209 of source electrode 210.

The TFT having the above-described arrangement is manufactured in the following manner. As shown in FIG. 13A, metal film 202a consisting of chromium (Cr), molybdenum (Mo), tungsten (W), or the like is deposited on a cleaned surface of transparent insulating substrate 201 to a thickness of, e.g., 1,000 Å by sputtering, vapor deposition, or the like. Insulating film 203a consisting of silicon nitride (SiN) or the like is deposited on metal film 202a to a thickness of, e.g., about 3000 Å by the plasma CVD or the like. Subsequently, amorphous silicon (a-i-Si) film 204a and n+-type amorphous silicon (a-n+-Si) film 206a doped with a high-concentration impurity are respectively deposited on the resultant structure to thicknesses of, e.g., about 1,000 Å and 500 Å by plasma CVD or the like. In addition, ohmic contact film 207a consisting of Cr, Ti, a noble metal silicide such as PTSi or PT$_2$Si, or the like for an ohmic contact is deposited on n+-type amorphous silicon 206a by sputtering or the like. The steps of stacking/forming metal film 202a, insulating film 203a, amorphous silicon 204a, n+-type amorphous silicon 206a, and ohmic contact film 207a on transparent insulating substrate 201 are continuously performed by sputtering and plasma CVD.

Figure 13B:
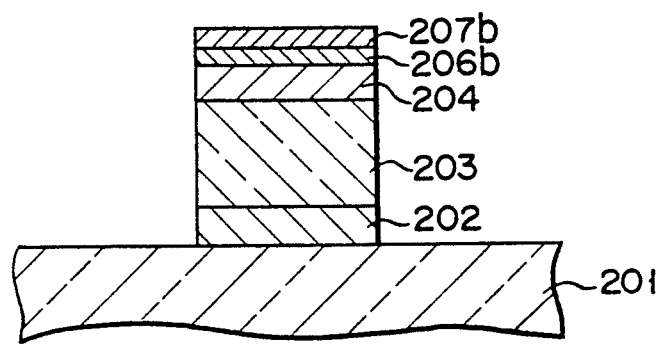
Figure 13C:
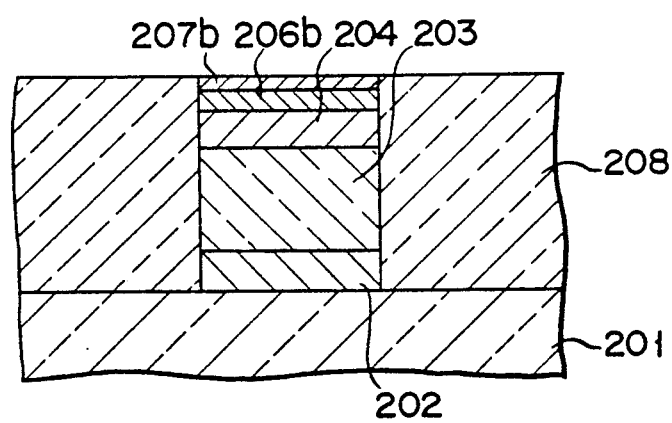
Figure 13D:
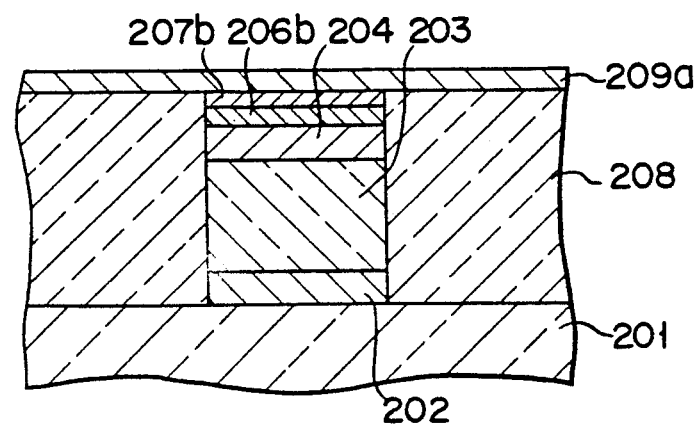

As shown in FIG. 13B, ohmic contact film 207a, n+-type amorphous silicon 206a, amorphous silicon 204a, insulating film 203a, and metal film 202a are etched to form gate electrode 202, a gate line (not shown) for supplying scan signals to gate electrode 202, gate insulating film 203, semiconductor film 204, contact film portion 206b, and ohmic contact electrode film 207b. Ohmic contact film 207a, n+-type amorphous silicon 206a, amorphous silicon 204a, insulating film 203a, and metal film 202a are continuously etched by, e.g., reactive etching. Alternatively, n+-type amorphous silicon 206a, amorphous silicon 204a, insulating film 203a may be etched by plasma etching, and metal film 202a may be etched by wet etching. Then, as shown in FIG. 13C, transparent insulating flattening film 208 consisting of a silica film or an organic substance such as acrylic is coated above transparent insulating substrate 201 to a height substantially equal to that of ohmic contact electrode film 207b by a spin coating method.

If flattening film 208 is also coated on ohmic contact electrode film 207b upon coating, flattening film 208 on film 207b is removed by etch back.

Figure 13E:
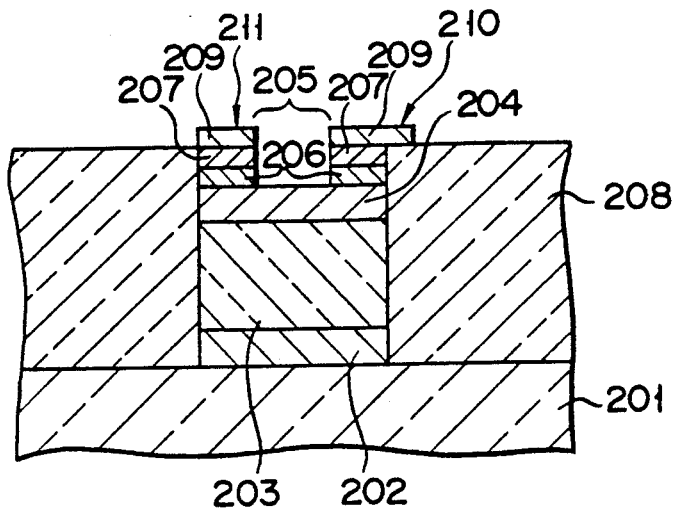

In addition, metal film 209a having a small specific resistance, such as an aluminum (Al), copper (Cu), or silver (Ag) film, is deposited on the entire surfaces of ohmic contact electrode film 207b and flattening film 208 above transparent insulating substrate 201 by sputtering, vapor deposition, or the like. Then, as shown in FIG. 13E, the corresponding position of channel portion 205 of metal film 209a, ohmic contact metal film 207b, and contact film portion 206b is continuously etched respectively by photolithography to form drain and source electrodes 211 and 210 each consisting of metal electrode 209, ohmic contact electrode 207, and contact film 206, and to form a drain line for supplying image signals to drain electrode 211.

Figure 13F:
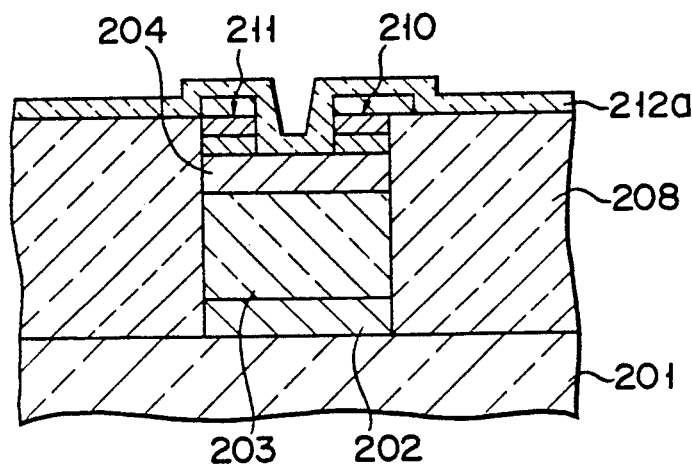
Figure 13G:
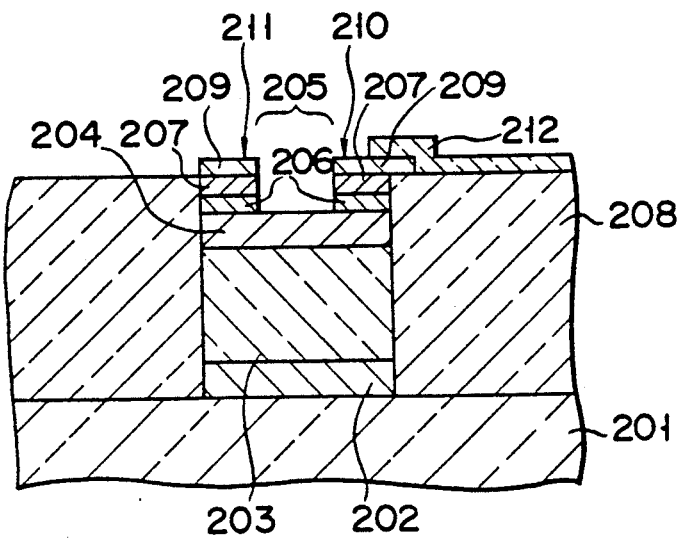

Subsequently, as shown in FIG. 13F, transparent conductive film 212a such as an ITO film is deposited on the entire surface above transparent insulating substrate 201 by vapor deposition or the like.

Finally, as shown in FIG. 13G, pixel electrode 212 is formed by photolithography or the like. With this process, a TFT active matrix panel is completed. In the TFT of this embodiment, since gate electrode 202, gate insulating film 203, semiconductor film 204, contact film 206, and ohmic contact electrode 207 can be successively formed in a series of steps, stable characteristics can be obtained. Since the stacked films obtained by the above-described series of steps are continuously etched, the number of steps is decreased.

A structure of another TFT to which the present invention can be applied will be described below. FIGS. 14 and 15 show this TFT. More specifically, gate electrode 302 is formed on glass substrate 301, and gate insulating film 303 consisting of silicon nitride and having a thickness of about 3,000 Å is stacked on gate electrode 302. Semiconductor film 304 consisting of amorphous silicon is stacked on part of gate insulating film 303, which corresponds to gate electrode 302. Circular source electrode 305 is formed on semiconductor film 304. Source electrode 305 has a diameter of, e.g., about 4 μm. Drain electrode 306 is formed in an annular shape on semiconductor film 304 substantially concentrically with source electrode 305, thereby forming a semiconductor channel portion in a partial annular shape between the two electrodes. Since the channel portion is formed so as to surround source electrode 305, if the distance between the two electrodes is channel length l, and the length of an arc defined by substantially intermediate points of channel length l is channel width W, channel width W is sufficiently larger than channel length l. Ratio l/W of channel length l to channel width W is one or less.

A plurality of TFTs 307 each arranged in the abovedescribed manner are arrayed on substrate 301 in the form of a matrix. Source electrode 305 of TFT 307 is connected to pixel electrode 308 consisting of a transparent conductive substance. Drain electrodes 306 of TFTs 307 arranged in the column direction are commonly connected to drain line 309. Gate electrodes 302 of TFTs 307 arranged in the row direction are commonly connected to gate line 310. In addition, a plurality of pixel electrodes 308 connected to source electrodes of TFTs 307 are arrayed above glass substrate 301 in the form of a matrix.

Figure 18:
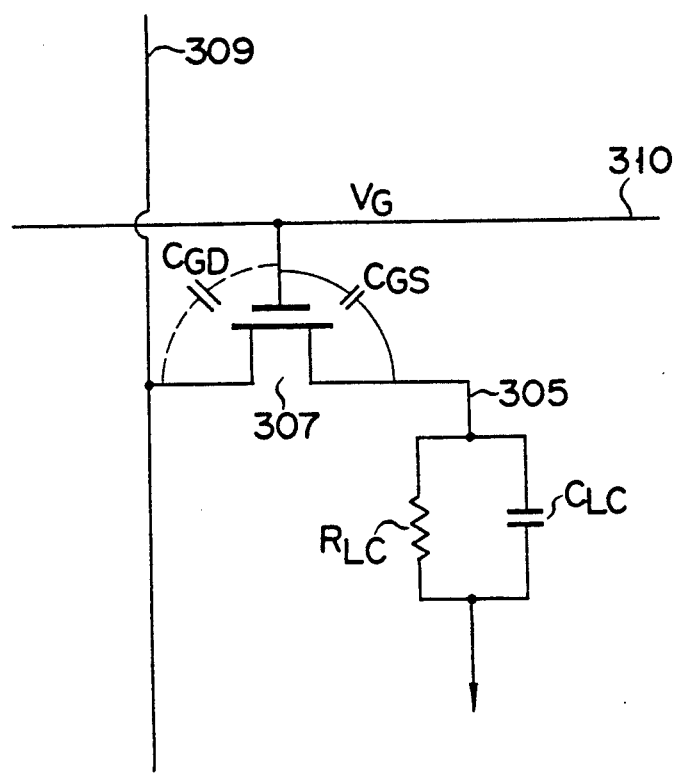
FIG. 18 shows an equivalent circuit diagram of a liquid crystal display element using the TFT in FIGS. 14 and 16.

In TFT 307, source electrode 305 is formed so as to be smaller than drain electrode 306. Therefore, the area where source and gate electrodes 305 and 302 overlap each other is considerably smaller than that where drain and gate electrodes 306 and 302 overlap each other. As indicated by an equivalent circuit diagram in FIG. 18, gate-source capacitance $C_{GS}$ present between gate and source electrodes 302 and 305 is very small. If, for example, source electrode 305 is a circular electrode having a diameter of 4 μm and gate insulating film 303 has a thickness of 3,000 Å as is the case with this embodiment, gate-source capacitance $C_{GS}$ is as small as about 0.003 PF. Assuming that equivalent capacitance $C_{LC}$ between two electrodes opposing each other through pixel electrode 308 and a corresponding liquid crystal is set to be 0.1 PF (in a case wherein the area of pixel electrode 308 is 100 μm × 100 μm), then a voltage drop ΔV across source electrode 305 can be represented by:

$$\Delta V = \{C_{GS}/(C_{GS}+C_{LS})\} \cdot V_G = \{0.003/(0.003+0.1)\} \cdot V_G$$

This voltage drop is as small as about 3% of gate voltage $V_G$. As described above, since the area of source electrode 305 is made small in this TFT, gate-source capacitance $C_{GS}$ can be made small compared with the capacitance generated between one pixel electrode and an electrode opposing the pixel electrode through a liquid crystal. Therefore, the influences of gate signals on source potentials can be reduced, and pixel electrode 308 can be micropatterned. In addition, since drain electrode 306 is formed so as to surround source electrode 305, a substantial channel width can be increased, and high drive performance of a thin film transistor can be realized.

A structure of a TFT according to still another embodiment will be described with reference to FIGS. 16 and 17. Since the fundamental structure of this TFT is the same as that of the TFT in FIGS. 14 and 15, the same reference numerals in FIGS. 16 and 17 denote the same parts as in FIGS. 14 and 15, and a description thereof will be omitted. Referring to FIGS. 16 and 17, source electrode 312 of TFT 311 has a rectangular shape. U-shaped drain electrode 313 is formed so as to surround rectangular source electrode 312. Similarly, in TFT 311, the area of source electrode 312 is made small, and hence the area where source and gate electrodes 312 and 302 overlap each other is small. Therefore, gate-source capacitance CGS between gate and source electrodes 302 and 312 is small, and the influence of a gate signal on a source potential is small. In addition, since drain electrode 313 is formed so as to surround source electrode 312, a channel width can be set to be sufficiently large.

Furthermore, in order to increase the opening ratio by increasing the area of pixel electrode 314 as much as possible, pixel electrode 314 is extended so that it partially overlaps gate electrode 302 as indicated by cross-hatched portions in FIG. 16. In this case, gate-source capacitance $C_{GS}$ between gate and source electrodes 302 and 312 is determined by the sum of areas D and C where gate and source electrodes 302 and 312, and gate and pixel electrodes 312 and 314 overlap each other, as indicated by the cross-hatched portions in FIG. 16. Therefore, area C where gate and pixel electrodes 302 and 314 overlap each other, and area D where gate and source electrodes 302 and 312 overlap each other are determined such that gate-source capacitance $C_{GS}$ determined by areas C and D becomes sufficiently small compared with equivalent capacitance $C_{LC}$ between one pixel electrode 314 and an electrode opposing the pixel electrode 314 through a liquid crystal.

Note that source and drain electrodes 312 and 313 may be formed into polygonal shapes without an acute angle, such as a pentagon and a hexagon, or elliptical shapes.

What is claimed is:

1. A thin film transistor, comprising:
   a transparent insulative substrate;
   a gate electrode formed on a part of a surface of said substrate;
   a gate insulating film formed on said substrate so as to cover at least said gate electrode;
   a semiconductor film, having a channel portion defined at a first surface part thereof, and being formed on at least said gate insulating film;
   source and drain electrodes formed on surface parts of said semiconductor film different from said first surface part at which said channel portion is defined so as to be separated from each other by a predetermined distance;
   an electrode insulating film for covering at least said source electrode and said gate insulating film; and
   a pixel electrode formed to overlap said gate insulating film and on said electrode insulating film, and electrically connected to said source electrode.

2. A thin film transistor according to claim 1, wherein said electrode insulating film is formed over the entire surface of said substrate except for a part where said source electrode and pixel electrode are electrically connected to each other, and
   said pixel electrode is formed on said electrode insulating film.

3. A transistor according to claim 2, wherein said electrode insulating film is a transparent flattening film for decreasing level differences caused by said plurality of films stacked on said substrate and obtaining a substantially flat surface.

4. A transistor according to claim 2, wherein a thickness of a portion of said electrode insulating film on said drain and source electrodes is smaller than 8,000 Å.

5. A thin film transistor according to claim 2, wherein said pixel electrode is formed on said electrode insulating film except for a section which opposes said drain electrode.

6. A thin film transistor according to claim 2, wherein said electrode insulating film has a through hole formed at a position of said source electrode, and said pixel electrode is electrically connected to said source electrode via said through hole.

7. A thin film transistor according to claim 6, further comprising
   a contact metal made of conductive metal material and embedded in said through hole.

8. A thin film transistor according to claim 7, wherein said contact metal is formed, as accumulated laminas, on said pixel electrode formed on said through hole.

9. A thin film transistor according to claim 7, wherein said pixel electrode is formed on said conductive metal material embedded in said through hole so as to be in contact with said conductive metal material.

10. A thin film transistor array for using a liquid crystal display device, comprising:
    a transparent insulative substrate;
    a plurality of gate lines and drain lines arranged in row and column directions on said substrate, for connecting to thin film layers deposited on said substrate;

a plurality of thin film transistors arranged on said substrate in the form of a matrix at cross points of said gate lines and said drain lines, each of said transistors having a gate electrode formed on said substrate, a gate insulating film formed on said substrate so as to cover at least the gate electrode, a semiconductor film, having a channel portion defined at a first surface part thereof, and being formed on at least said gate insulating film, source and drain electrodes formed on surface parts of said semiconductor film different from said first surface part at which said channel portion is defined so as to be separated from each other by a predetermined distance, an electrode insulating film for covering at least said source electrode and said gate insulating film; and a pixel electrode formed to overlap said gate insulating film and on said electrode insulating film, and electrically connected to said source electrode.

11. A thin film transistor array according to claim 10, wherein said electrode insulating film is coated over the entire surface of said substrate except for sections where said plurality of source electrodes of said plurality of thin film transistors are electrically connected to each of said pixel electrodes, and said plurality of pixel electrodes are formed and arranged on said electrode insulating film in the form of a matrix.

12. An array according to claim 11, wherein said electrode insulating film is transparent flattening film for decreasing level differences caused by said plurality of thin film transistors formed on said substrate and obtaining substantially flat surfaces.

13. An array according to claim 11, wherein said electrode insulating film consists of two film, i.e., a flattening film formed by coating and baking a viscous material, and a film for insulation formed by CVD.

14. A thin film transistor array according to claim 11, wherein said plurality of pixel electrodes are formed on said electrode insulating film except for sections opposing said channel portions of said transistors connected to adjacent pixel electrodes.

15. An array according to claim 14, wherein said pixel electrodes are located with their edges vertically aligned with, or overlapping, the edges of said drain electrodes and the edges of said drain and gate lines of said thin film transistors, respectively.

16. An array according to claim 11, wherein said electrode insulating film has a plurality of through holes formed therein at positions corresponding to said source electrodes of said plurality of thin film transistors, and said plurality of pixel electrodes are electrically connected to said source electrodes of the corresponding thin film transistors through said through holes.

17. An array according to claim 16, further comprising shield film formed on said electrode insulating film above said channel portions of said semiconductor films of said thin film transistors, and contact metals formed in only said through holes and on said insulating film covered with said shield films.

18. An array according to claim 16, further comprising contact metals consisting of metal conductive materials buried in said plurality of through holes, said plurality of pixel electrodes being stacked on said electrode insulating film so as to be electrically connected to said metal conductive materials.

19. An array according to claim 10, wherein each of said plurality of thin film transistors has a gate electrode, a gate insulating film, a semiconductor film, and source and drain electrodes all of which have identical edge shapes.

* * * * *